(12) United States Patent
Kim

(10) Patent No.: US 9,165,618 B2
(45) Date of Patent: Oct. 20, 2015

(54) SEMICONDUCTOR MEMORY DEVICE FOR CONDUCTING MONITORING OPERATION TO VERIFY READ AND WRITE OPERATIONS

(71) Applicant: SK hynix Inc., Icheon-si (KR)

(72) Inventor: Jin Ah Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 149 days.

(21) Appl. No.: 13/719,018

(22) Filed: Dec. 18, 2012

(65) Prior Publication Data

US 2014/0050037 A1 Feb. 20, 2014

(30) Foreign Application Priority Data

Aug. 20, 2012 (KR) .................. 10-2012-0090934

(51) Int. Cl.
*G11C 7/00* (2006.01)
*G11C 7/22* (2006.01)
*G11C 7/10* (2006.01)
*G11C 7/02* (2006.01)
*G11C 11/4096* (2006.01)

(52) U.S. Cl.
CPC ............... *G11C 7/1078* (2013.01); *G11C 7/02* (2013.01); *G11C 7/1006* (2013.01); *G11C 7/1069* (2013.01); *G11C 7/1096* (2013.01); *G11C 11/4096* (2013.01)

(58) Field of Classification Search
None
See application file for complete search history.

(56) References Cited

U.S. PATENT DOCUMENTS 6,986,087 B2 * 1/2006 Laake et al. .................. 714/724

FOREIGN PATENT DOCUMENTS

KR 1020050100284 A 10/2005
KR 1020080026725 A 3/2008

* cited by examiner

*Primary Examiner* — Kretelia Graham
(74) *Attorney, Agent, or Firm* — Kilpatrick Townsend & Stockton LLP

(57) ABSTRACT

A semiconductor memory device includes, in part, a first data I/O block and a second data I/O block. During a write operation, the first data I/O block transmits input data supplied through a first pad to a first global I/O line, and further generates a write internal signal. The second data I/O block transmits the write internal signal to a second pad in response to a monitor enable signal. During a read operation, the first data I/O block supplies data from the first global I/O line to a first pad, and further generates a read internal signal. The second data I/O block transmits the read internal signal to the second pad in response to a monitor enable signal.

13 Claims, 6 Drawing Sheets

SEMICONDUCTOR MEMORY DEVICE FOR CONDUCTING MONITORING OPERATION TO VERIFY READ AND WRITE OPERATIONS

CROSS-REFERENCE TO RELATED APPLICATION

The present application claims priority under 35 U.S.C 119(a) to Korean Application No. 10-2012-0090934, filed on Aug. 20, 2012, in the Korean Intellectual Property Office, the content of which is incorporated herein by reference in its entirety.

BACKGROUND

Embodiments of the present disclosure relate to semiconductor memory devices.

Computer systems or electronic communication systems continue to advance in parallel with increases in the storage capacity and lower fabrication cost of the semiconductor memory devices used in such systems. In particular, a high integration density of the semiconductor memory devices may lead to a high capacity of data storage thereof. The semiconductor memory devices, for example, dynamic random access memory (DRAM) devices may be configured to include a plurality of word lines and a plurality of bit lines which are arrayed in rows and columns to intersect each other, and a plurality of memory cells may be disposed at respective ones of cross points of the word lines and the bit lines. Each of the memory cells of the DRAM devices may be configured to include a single cell transistor and a single capacitor, and the memory cells of the DRAM devices may constitute one or more cell blocks. Operations of the DRAM devices may be briefly described hereinafter.

If a complementary (e.g., inversed) row address strobe (/RAS) signal is enabled during an active operation, a row address signal supplied through a row address buffer may be decoded to execute a row decoding operation that selects one of word lines in a cell block. In such a case, if data in memory cells electrically connected to the selected word line are loaded on bit line pairs including bit lines and complementary bit lines, a signal informing of a point of time that sense amplifiers operate may be enabled to drive a sense amplifier drive circuit of a cell block which is selected by the row address signal. In addition, bias potentials of the sense amplifiers may be changed into a core potential (Vcore) or a ground potential (Vss) by the sense amplifier drive circuit, and the sense amplifiers may operate. If the sense amplifiers operate, a small potential difference between a bit line potential and a complementary bit line potential may be amplified to have a large potential difference.

Subsequently, if a read operation is executed, at least one of the bit line data amplified by the sense amplifiers may be transmitted to an input/output (I/O) line through a column transfer transistor which is selected and turned on by a column address signal. Meanwhile, if a write operation is executed, a data supplied through the I/O line may be loaded on the bit line through the column transfer transistor which is selected and turned on by a column address signal, and the data on the bit line may be stored in a memory cell through at least one of cell transistors which are turned on by a selected word line.

As described above, the semiconductor memory devices may operate in a write mode to store data into the memory cells, or a read mode to read out the data stored in the memory cells. When the write operation and the read operation are executed, a plurality of internal signals may be generated in the semiconductor memory device.

SUMMARY

Example embodiments are directed to semiconductor memory devices.

According to some embodiments, a semiconductor memory device includes a first data I/O block and a second data I/O block. The first data I/O block executes a write operation to transmit a first input data supplied through a first pad to a first global I/O line, and further generates a write internal signal. The second data I/O block transmits the write internal signal to a second pad in response to a monitor enable signal.

According to further embodiments, a semiconductor memory device includes a first data I/O block and a second data I/O block. The first data I/O block executes a read operation thereby causing the data on a first global I/O line to be supplied to a first pad. The first data I/O block generates a read internal signal during the read operation. The second data I/O block transmits the read internal signal to a second pad in response to a monitor enable signal.

According to further embodiments, a semiconductor memory device includes a first data input block, a second data input block and a data I/O block. The first data input block buffers a first input data supplied through a first pad to generate a first internal input data. In addition, the first data input block executes a first write operation to load the first internal input data on a first global I/O line. Moreover, the first data input block generates a write internal signal during the first write operation. The second data input block buffers a second input data supplied through a second pad to generate a second internal input data. The second data input executes a second write operation to load the second internal input data on a second global I/O line. The data I/O block transmits the write internal signal to a third pad in response to a monitor enable signal. The data I/O block executes a third write operation to load the second internal input data on a third global I/O line.

A method of operating a semiconductor memory device, in accordance with one embodiment of the present invention includes, in part, executing a write operation to transmit a first input data from a first pad to a first global I/O line, generating a write internal signal during the write operation, and transmitting the write internal signal to a second pad in response to a monitor enable signal.

A method of operating a semiconductor memory device, in accordance with another embodiment of the present invention includes, in part, performing a read operation to supply a data from a first global I/O line to a first pad, generating a read internal signal, and transmitting the read internal signal to a second pad in response to a monitor enable signal.

A method of operating a semiconductor memory device, in accordance with another embodiment of the present invention includes, in part, buffering a first input data supplied through a first pad to generate a first internal input data, loading the first internal input data onto a first global I/O line during a first write operation, generating a write internal signal during the first write operation, buffering a second input data supplied through a second pad to generate a second internal input data, executing a second write operation to load the second internal input data on a second global I/O line, transmitting the write internal signal to a third pad in response to a monitor enable signal, and executing a third write operation to load the second internal input data onto a third global I/O line.

BRIEF DESCRIPTION OF THE DRAWINGS

Embodiments of the inventive concept will become more apparent in view of the attached drawings and accompanying detailed description, in which.

DETAILED DESCRIPTION OF THE EMBODIMENTS

Embodiments of the inventive concept will be described hereinafter with reference to the accompanying drawings. However, the embodiments described herein are for illustrative purposes only and are not intended to limit the scope of the inventive concept.

Figure 1:
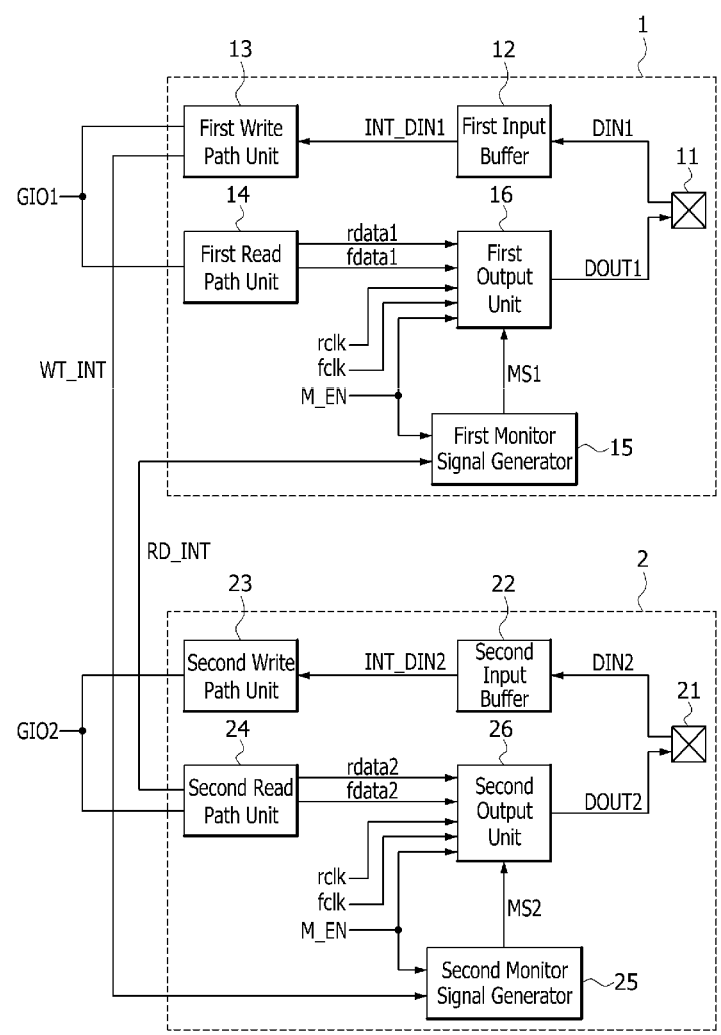
FIG. 1 is a block diagram of a semiconductor memory device, according to one embodiment.

FIG. 1 is a block diagram of a semiconductor memory device according to one embodiment.

As illustrated in FIG. 1, semiconductor memory device may be configured to include a first data I/O block 1 and a second data I/O block 2. The first data I/O block 1 may be configured to include a first pad 11, a first input buffer 12, a first write path unit 13, a first read path unit 14, a first monitor signal generator 15 and a first output unit 16. The second data I/O block 2 may be configured to include a second pad 21, a second input buffer 22, a second write path unit 23, a second read path unit 24, a second monitor signal generator 25 and a second output unit 26.

The first input buffer 12 may buffer a first input data DIN1 supplied through the first pad 11 to generate a first internal input data INT_DIN1 when the first data I/O block 1 operates in a write mode. The first write path unit 13 may drive a first global I/O line GIO1 to transmit the first internal input data INT_DIN1 to the first global I/O line GIO1 when the first data I/O block 1 operates in the write mode. The first write path unit 13 may also generate and output a write internal signal WT_INT when the first internal input data INT_DIN1 is transmitted to the first global I/O line GIO1. The first read path unit 14 may receive first internal output data RDATA1 and FDATA1 from data loaded on the first global I/O line GIO1 when the first data I/O block 1 operates in a read mode. The first monitor signal generator 15 may buffer a read internal signal RD_INT to generate a first monitor signal MS1 when a monitor enable signal M_EN is enabled. The first output unit 16 may selectively output the first internal output data RDATA1 and FDATA1 or the first monitor signal MS1 as a first output data DOUT1 in response to the monitor enable signal M_EN. The first output data DOUT1 may be supplied through the first pad 11. The first output unit 16 may output the first monitor signal MS1 as the first output data DOUT1 when the monitor enable signal M_EN is enabled. The first output unit 16 may output the first internal output data RDATA1 and FDATA1 as the first output data DOUT1 in synchronization with internal clock signals RCLK and FCLK when the monitor enable signal M_EN is disabled. The monitor enable signal M_EN may be enabled to monitor the write internal signal WT_INT and the read internal signal RD_INT.

The second input buffer 22 may buffer a second input data DIN2 supplied through the second pad 21 to generate a second internal input data INT_DIN2 when the second data I/O block 2 operates in a write mode. The second write path unit 23 may transmit the second internal input data INT_DIN2 to a second global I/O line GIO2 when the second data I/O block 2 operates in the write mode. The second read path unit 24 may receive second internal output data RDATA2 and FDATA2 from data loaded on the second global I/O line GIO2 when the second data I/O block 2 operates in a read mode. The second read path unit 24 may also generate and output the read internal signal RD_INT when the second internal output data RDATA2 and FDATA2 are extracted from the data loaded on the second global I/O line GIO2. The second monitor signal generator 25 may buffer the write internal signal WT_INT to generate a second monitor signal MS2 when the monitor enable signal M_EN is enabled. The second output unit 26 may selectively output the second internal output data RDATA2 and FDATA2 or the second monitor signal MS2 as a second output data DOUT2 in response to the monitor enable signal M_EN. The second output data DOUT2 may be supplied through the second pad 21. The second output unit 26 may output the second monitor signal MS2 as the second output data DOUT2 when the monitor enable signal M_EN is enabled. The second output unit 26 may output the second internal output data RDATA2 and FDATA2 as the second output data DOUT2 in synchronization with the internal clock signals RCLK and FCLK when the monitor enable signal M_EN is disabled.

Figure 2:
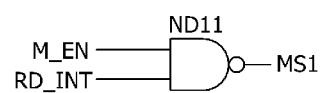
FIG. 2 is a circuit diagram of an example of the first monitor signal generator of the semiconductor memory device of FIG. 1.
Figure 3:
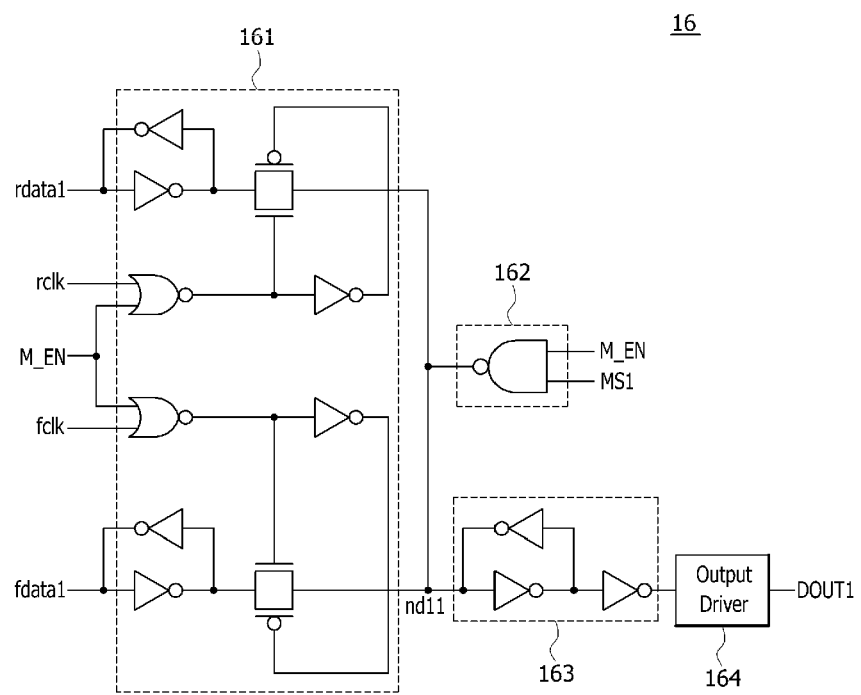
FIG. 3 is a circuit diagram of an example of the first output unit of the semiconductor memory device of FIG. 1.

FIG. 2 is a circuit diagram of an example of first monitor signal generator 15 of the semiconductor memory device of FIG. 1. FIG. 3 is a circuit diagram of an example of first output unit 16 of the semiconductor memory device of FIG. 1.

As illustrated in FIG. 2, the first monitor signal generator 15 may be configured to have a NAND gate ND11. The NAND gate ND11 may receive the monitor enable signal M_EN and the read internal signal RD_INT as two input signals thereof and may generate the first monitor signal MS1 as an output signal thereof. When the monitor enable signal M_EN is enabled to have a logic "high" level, the first monitor signal generator 15 may inversely buffer the read internal signal RD_INT and may output the inversely buffered read internal signal RD_INT as the first monitor signal MS1. The second monitor signal generator 25 may have the same or similar configuration as the first monitor signal generator 15. That is, the second monitor signal generator 25 may also be configured to have a NAND gate, and the NAND gate may receive the monitor enable signal M_EN and the write internal signal WT_INT as two input signals thereof and may generate the second monitor signal MS2 as an output signal thereof.

As illustrated in FIG. 3, the first output unit 16 may be configured to include an internal data transmitter 161, a monitor signal transmitter 162, a latch unit 163 and an output driver 164. The internal data transmitter 161 may inversely buffer the first internal output data RDATA1 and FDATA1 and may transmit the inversely buffered first internal output data RDATA1 and FDATA1 to an internal node ND11 in synchronization with the internal clock signals RCLK and FCLK when the monitor enable signal M_EN is disabled to have a logic "low" level. The monitor signal transmitter 162 may inversely buffer the first monitor signal MS1 and may transmit the inversely buffered first monitor signal MS1 to the internal node ND11 when the monitor enable signal M_EN is enabled to have a logic "high" level. The latch unit 163 may latch a signal on the internal node ND11 and may buffer and output the latched signal. The output driver 164 may generate the first output data DOUT1 in response to the output signal of the latch unit 163. The second output unit 26 may have substantially the same configuration as the first output unit 16. In other words, the second output unit 26 may have the same circuit as the first output unit 16. The only difference between the first and second output units 16 and 26 is that I/O signals of the first output unit 16 are different from I/O signals of the second output unit 26.

Hereinafter, a monitoring operation of the semiconductor memory device described above will be developed. The monitoring operation may include a first monitoring operation which is executed when the first data I/O block 1 operates in a write mode and a second monitoring operation which is executed when the second data I/O block 2 operates in a read mode.

First, when the first data I/O block 1 operates in a write mode, the second monitor signal generator 25 may buffer the write internal signal WT_INT generated by the first write path unit 13 to generate the second monitor signal MS2 if the monitor enable signal M_EN is enabled. The second output unit 26 may buffer the second monitor signal MS2 and may transmit the buffered second monitor signal MS2 to the second pad 21.

Next, when the second data I/O block 2 operates in a read mode, the first monitor signal generator 15 may buffer the read internal signal RD_INT generated by the second read path unit 24 to generate the first monitor signal MS1 if the monitor enable signal M_EN is enabled. The first output unit 16 may buffer the first monitor signal MS1 and may transmit the buffered first monitor signal MS1 to the first pad 11.

As described above, the write internal signal WT_INT generated when the first data I/O block 1 operates in a write mode may be verified through the second pad 21. Hence, a write operation of the first data I/O block 1 can be monitored by reading out the write internal signal WT_INT through the second data I/O block 2 which is separated from the first data I/O block 1. Thus, a design margin relating to the write internal signal WT_INT may be verified by the monitoring operation, and failure analysis of the semiconductor memory device may be more readily performed. Further, the read internal signal RD_INT generated when the second data I/O block 2 operates in a read mode may be verified through the first pad 11. Hence, a read operation of the second data I/O block 2 can be monitored by reading out the read internal signal RD_INT through the first data I/O block 1 which is separated from the second data I/O block 2. Thus, a design margin relating to the read internal signal RD_INT may be verified by the monitoring operation, and failure analysis of the semiconductor memory device may be more readily performed.

Figure 4:
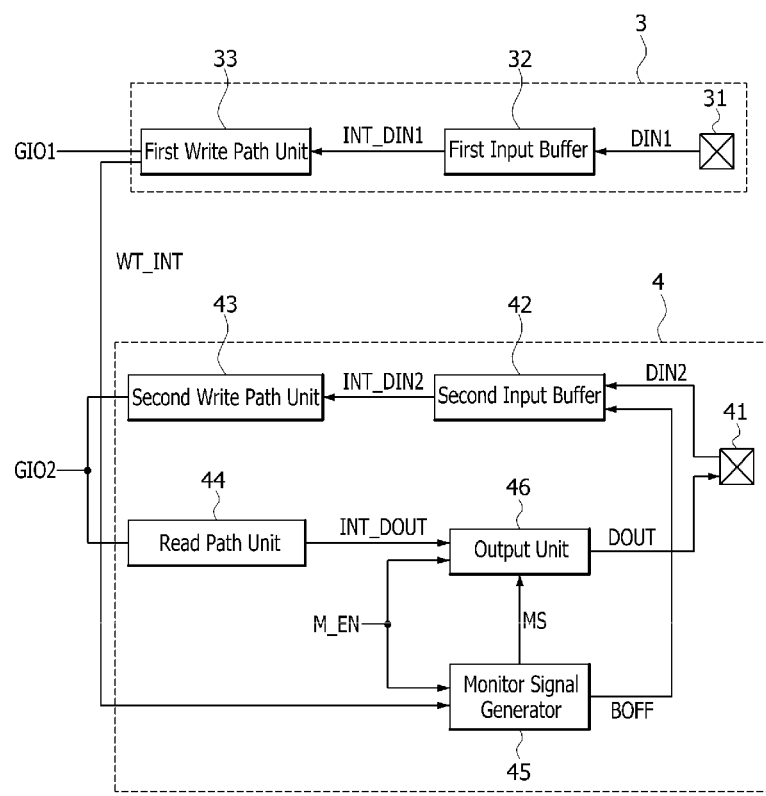
FIG. 4 is a block diagram of a semiconductor memory device, according to another embodiment.

FIG. 4 is a block diagram of a semiconductor memory device 200 according to another embodiment.

As illustrated in FIG. 4, semiconductor memory device 200 according to the present embodiment may be configured to include a data input block 3 and a data I/O block 4. The data input block 3 may be configured to include a first pad 31, a first input buffer 32 and a first write path unit 33. The data I/O block 4 may be configured to include a second pad 41, a second input buffer 42, a second write path unit 43, a read path unit 44, a monitor signal generator 45 and an output unit 46.

The first input buffer 32 may buffer a first input data DIN1 supplied through the first pad 31 to generate a first internal input data INT_DIN1 when the data input block 3 operates in a write mode. The first write path unit 33 may drive a first global I/O line to transmit the first internal input data INT_DIN1 to the first global I/O line GIO1 when the data input block 3 operates in the write mode. The first write path unit 33 may also generate and output a write internal signal WT_INT when the first internal input data INT_DIN1 is transmitted to the first global I/O line GIO1.

The second input buffer 42 may buffer a second input data DIN2 supplied through the second pad 41 to generate a second internal input data INT_DIN2 when the data I/O block 4 operates in a write mode. The second input buffer 42 may interrupt buffering the second input data DIN2 in response to a buffer off signal BOFF when a monitor enable signal M_EN is enabled. The second write path unit 43 may transmit the second internal input data INT_DIN2 to a second global I/O line GIO2 when the data I/O block 4 operates in the write mode. The read path unit 44 may receive internal output data INT_DOUT from data loaded on the second global I/O line GIO2 when the data I/O block 4 operates in a read mode. The monitor signal generator 45 may buffer the write internal signal WT_INT to generate a monitor signal MS when the monitor enable signal M_EN is enabled. The monitor signal generator 45 may also generate the buffer off signal BOFF for interrupting the operation of the second input buffer 42 when the monitor enable signal M_EN is enabled. The output unit 46 may selectively output the internal output data INT_DOUT or the monitor signal MS as an output data DOUT in response to the monitor enable signal M_EN. The output data DOUT may be supplied through the second pad 41. The output unit 26 may output the monitor signal MS as the output data DOUT when the monitor enable signal M_EN is enabled. Alternatively, the output unit 26 may output the internal output data INT_DOUT as the output data DOUT when the monitor enable signal M_EN is disabled. As described above, the write internal signal WT_INT generated when the data input block 3 operates in a write mode may be verified through the second pad 41. Hence, a write operation of the first data input block 3 can be monitored by reading out the write internal signal WT_INT through the data I/O block 4 which is separated from the data input block 3. Thus, a design margin relating to the write internal signal WT_INT may be verified by the monitoring operation, and failure analysis of the semiconductor memory device may be more readily performed. Further, the operation of the second input buffer 42 may be interrupted when the write internal signal WT_INT is monitored. This is for preventing the write internal signal WT_INT from being disrupted by the operation of the second input buffer 42 when the write internal signal WT_INT is monitored through the second pad 41.

Figure 5:
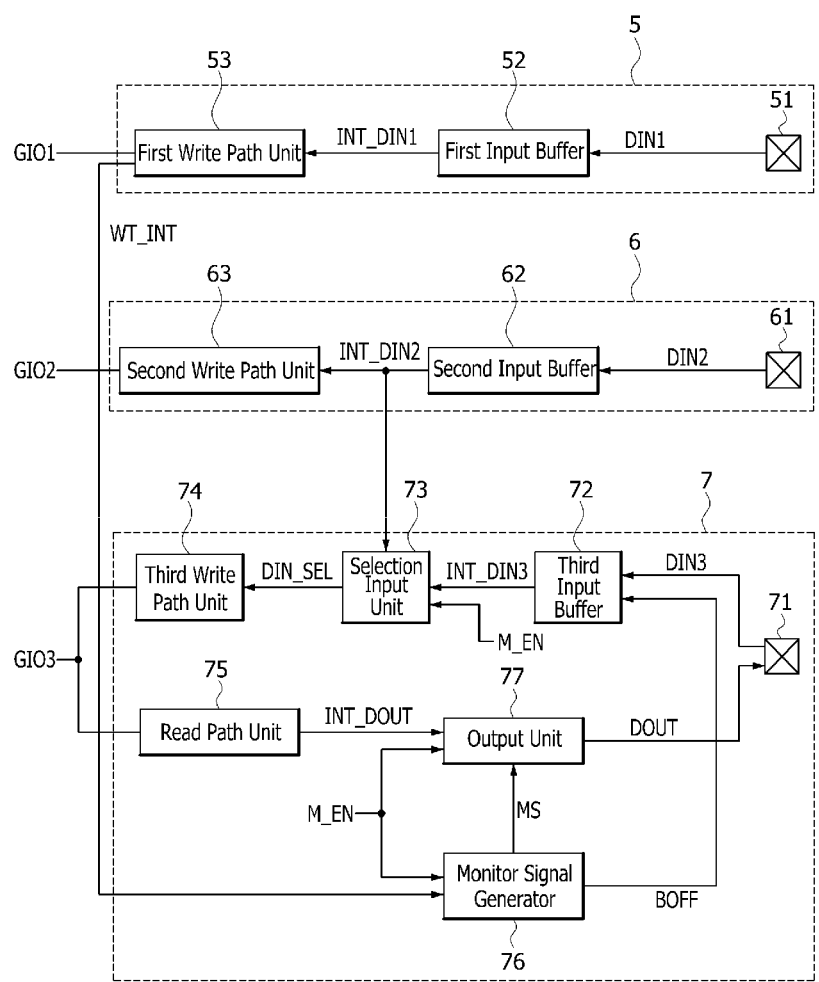
FIG. 5 is a block diagram of a semiconductor memory device, according to yet another embodiment of the present invention.

FIG. 5 is a block diagram illustrating a configuration of a semiconductor memory device 300 according to yet another embodiment.

As illustrated in FIG. 5, semiconductor memory device 300 may be configured to include a first data input block 5, a second data input block 6 and a data I/O block 7. The first data input block 5 may be configured to include a first pad 51, a first input buffer 52 and a first write path unit 53. The second data input block 6 may be configured to include a second pad 61, a second input buffer 62 and a second write path unit 63. The data I/O block 7 may be configured to include a third pad 71, a third input buffer 72, a selection input unit 73, a third write path unit 74, a read path unit 75, a monitor signal generator 76 and an output unit 77.

The first input buffer 52 may buffer a first input data DIN1 supplied through the first pad 51 to generate a first internal input data INT_DIN1 when the first data input block 5 operates in a write mode. The first write path unit 53 may drive a first global I/O line GIO1 to transmit the first internal input data INT_DIN1 to the first global I/O line GIO1 when the first data input block 5 operates in the write mode. The first write path unit 53 may also generate and output a write internal signal WT_INT when the first internal input data INT_DIN1 is transmitted to the first global I/O line GIO1.

The second input buffer 62 may buffer a second input data DIN2 supplied through the second pad 61 to generate a second internal input data INT_DIN2 when the second data input block 6 operates in a write mode. The second write path unit 63 may transmit the second internal input data INT_DIN2 to a second global I/O line GIO2 when the second data input block 6 operates in the write mode.

The third input buffer 72 may buffer a third input data DIN3 supplied through the third pad 71 to generate a third internal input data INT_DIN3 when the data I/O block 7 operates in a write mode. The third input buffer 72 may interrupt buffering the third input data DIN3 in response to a buffer off signal BOFF when a monitor enable signal M_EN is enabled. The selection input unit 73 may selectively output the second internal input data INT_DIN2 or the third internal input data INT_DIN3 as a selection input data DIN_SEL in response to the monitor enable signal M_EN. The third write path unit 74 may transmit the selection input data DIN_SEL to a third global I/O line GIO3 when the data I/O block 7 operates in the write mode. The read path unit 75 may receive internal output data INT_DOUT from data loaded on the third global I/O line GIO3 when the data I/O block 7 operates in a read mode. The monitor signal generator 76 may buffer the write internal signal WT_INT to generate a monitor signal MS when the monitor enable signal M_EN is enabled. The monitor signal generator 76 may also generate the buffer off signal BOFF for interrupting the operation of the third input buffer 72 when the monitor enable signal M_EN is enabled. The output unit 77 may selectively output the internal output data INT_DOUT or the monitor signal MS as an output data DOUT in response to the monitor enable signal M_EN. The output data DOUT may be supplied through the third pad 71. The output unit 77 may output the monitor signal MS as the output data DOUT when the monitor enable signal M_EN is enabled. Alternatively, the output unit 77 may output the internal output data INT_DOUT as the output data DOUT when the monitor enable signal M_EN is disabled.

Figure 6:
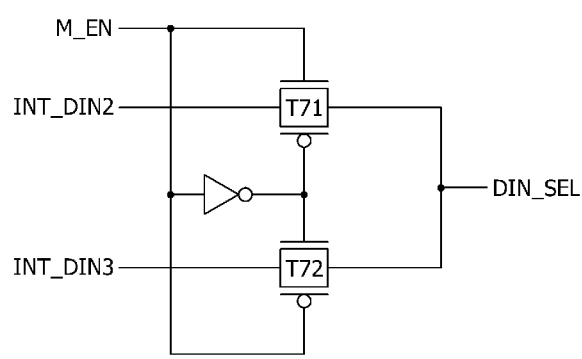
FIG. 6 is a circuit diagram of an example of the selection input unit of the semiconductor memory device of FIG. 5.

FIG. 6 is a circuit diagram illustrating an example of a selection input unit included in the semiconductor memory device 300 of FIG. 5.

As illustrated in FIG. 6, the selection input unit 73 may be configured to include a transfer gate T71 supplying the second internal input data INT_DIN2 as the selection input data DIN_SEL when the monitor enable signal M_EN is enabled to have a logic "high" level, and a transfer gate T72 supplying the third internal input data INT_DIN3 as the selection input data DIN_SEL when the monitor enable signal M_EN is disabled to have a logic "low" level.

As described above, the write internal signal WT_INT generated when the first data input block 5 operates in a write mode may be verified through the third pad 71. That is, a write operation of the first data input block 5 can be monitored by reading out the write internal signal WT_INT through the data I/O block 7 which is separated from the first data input block 5. Thus, a design margin relating to the write internal signal WT_INT may be verified by the monitoring operation, and failure of the semiconductor memory device 300 may be more readily performed. Further, the operation of the third input buffer 72 may be interrupted when the write internal signal WT_INT is monitored. This is for preventing the write internal signal WT_INT from being disrupted by the operation of the third input buffer 72 when the write internal signal WT_INT is monitored through the third pad 71. Moreover, according to the present embodiment, a write operation may be executed by the second internal input data INT_DIN2 transmitted to the selection input unit 73 even when the write internal signal WT_INT is monitored through the third pad 71. Therefore, even when the data I/O block 7 receives data from the second data input block 6 to execute a write operation for transmitting the data to the third global I/O line GIO3, a write operation of the first data input unit 5 may be monitored. Thus, an additional and special time may not be required to monitor the write operation of the first data input unit 5.

The example embodiments of the inventive concept have been disclosed above for illustrative purposes. Those skilled in the art will appreciate that various modifications, additions and substitutions are possible, without departing from the scope and spirit of the inventive concept as disclosed in the accompanying claims.

What is claimed is:

1. A semiconductor memory device, comprising:
a first data I/O block configured to execute a write operation to transmit a first input data from a first pad to a first global I/O line, the first data I/O block further configured to generate a write internal signal during the write operation; and
a second data I/O block configured to transmit the write internal signal to a second pad in response to a monitor enable signal,
wherein the first data I/O block comprises:
an input buffer configured to buffer the first input data received from the first pad, and to supply a first internal input data during the write operation; and
a write path unit configured to drive the first global I/O line in response to the first internal input data, the write path unit being further configured to generate the write internal signal.

2. The semiconductor memory device of claim 1, wherein the second data I/O block comprises:
a monitor signal generator configured to buffer the write internal signal, and to generate a monitor signal in response to the monitor enable signal; and
an output unit configured to transmit the monitor signal to the second pad in response to the monitor enable signal.

3. The semiconductor memory device of claim 2, wherein the monitor signal generator is configured to generate a buffer off signal for interrupting a buffering operation of a second input data supplied through the second pad when the monitor enable signal is enabled.

4. The semiconductor memory device of claim 3, wherein the output unit comprises:
an internal data transmitter configured to transmit an internal output data to an internal node in synchronization with an internal clock when the monitor enable signal is disabled and the second data I/O block operates in a read mode; and
a monitor signal transmitter configured to transmit the monitor signal to the internal node when the monitor enable signal is enabled.

5. The semiconductor memory device of claim 4, wherein the output unit further comprises:
a latch unit configured to latch a signal on the internal node; and
an output driver configured to generate an output data in response to the latched signal.

6. The semiconductor memory device of claim 1, wherein the second data I/O block is configured to execute a read operation that outputs data of a second global I/O line onto the second pad, the second data I/O block being further configured to output a read internal signal generated during the read operation.

7. The semiconductor memory device of claim 6, wherein the second data I/O block comprises:
   a read path unit configured to receive an internal output data from the second global I/O line during the read operation, and to output the read internal signal in response; and
   an output unit configured to transmit the internal output data to the second pad in response to an internal clock when the monitor enable signal is disabled.

8. The semiconductor memory device of claim 6, wherein the first data I/O block is configured to transmit the read internal signal to the first pad in response to the monitor enable signal.

9. The semiconductor memory device of claim 8, wherein the first data I/O block comprises:
   a monitor signal generator configured to buffer the read internal signal to generate a monitor signal in response to the monitor enable signal; and
   an output unit configured to transmit the monitor signal to the first pad in response to the monitor enable signal.

10. The semiconductor memory device of claim 9, wherein the output unit comprises:
    an internal data transmitter configured to transmit an internal output data to an internal node in synchronization with an internal clock when the monitor enable signal is disabled and the first data I/O block operates in a read mode; and
    a monitor signal transmitter configured to transmit the monitor signal to the internal node when the monitor enable signal is enabled.

11. The semiconductor memory device of claim 10, wherein the output unit further includes:
    a latch unit configured to latch a signal of the internal node; and
    an output driver configured to generate an output data in response to the latched signal.

12. A method of operating a semiconductor memory device, the method comprising:
    executing a write operation to transmit a first input data from a first pad to a first global I/O line;
    generating a write internal signal during the write operation;
    transmitting the write internal signal to a second pad in response to a monitor enable signal;
    buffering the first input data received from the first pad;
    supplying a first internal input data during the write operation; and
    driving the first global I/O line in response to the first internal input data.

13. The method of claim 12 further comprising:
    buffering the write internal signal;
    generating a monitor signal in response to the monitor enable signal; and
    transmitting the monitor signal to the second pad in response to the monitor enable signal.

* * * * *